US008729688B2

(12) United States Patent
Jung et al.

(10) Patent No.: US 8,729,688 B2
(45) Date of Patent: May 20, 2014

(54) STACKED SEMINCONDUCTOR PACKAGE

(75) Inventors: Yong Ha Jung, Incheon (KR); Dae Jin Kim, Cheonan-si (KR)

(73) Assignee: Hana Micron Inc., Chungcheongnam-do (KR)

( * ) Notice: Subject to any disclaimer, the term of this patent is extended or adjusted under 35 U.S.C. 154(b) by 0 days.

(21) Appl. No.: 13/697,266

(22) PCT Filed: May 11, 2011

(86) PCT No.: PCT/KR2011/003467
§ 371 (c)(1),
(2), (4) Date: Dec. 28, 2012

(87) PCT Pub. No.: WO2011/142581
PCT Pub. Date: Nov. 17, 2011

(65) Prior Publication Data

US 2013/0127070 A1 May 23, 2013

(30) Foreign Application Priority Data

May 10, 2010 (KR) ........................ 10-2010-0043641

(51) Int. Cl.
*H01L 23/02* (2006.01)

(52) U.S. Cl.
USPC ................... 257/686; 257/777; 257/E25.006; 257/E25.021; 257/E25.027; 257/E23.085

(58) Field of Classification Search
USPC .................. 257/686, 777, E25.006, E25.013, 257/E25.021, E25.027, E23.085; 438/109, 438/FOR. 368, FOR. 426
See application file for complete search history.

(56) References Cited

U.S. PATENT DOCUMENTS

| | | | | |
|---|---|---|---|---|
| 7,021,520 | B2 * | 4/2006 | Bowen | 228/180.5 |
| 7,352,057 | B2 * | 4/2008 | Grafe et al. | 257/686 |
| 7,663,246 | B2 * | 2/2010 | Chen et al. | 257/777 |
| 8,026,586 | B2 * | 9/2011 | Kim | 257/686 |
| 2007/0045864 | A1 * | 3/2007 | Shiba et al. | 257/777 |
| 2007/0252263 | A1 * | 11/2007 | Jow | 257/690 |
| 2009/0096111 | A1 * | 4/2009 | Fujiwara et al. | 257/777 |

FOREIGN PATENT DOCUMENTS

| | | | |
|---|---|---|---|
| JP | 07-014939 | A | 1/1995 |
| JP | 2001-217388 | A | 8/2001 |
| JP | 2002-033442 | A | 1/2002 |
| JP | 2005-539403 | A | 12/2005 |
| KR | 1020070009776 | A | 1/2007 |
| KR | 1020070045970 | A | 5/2007 |

* cited by examiner

*Primary Examiner* — Jasmine Clark
(74) *Attorney, Agent, or Firm* — Reinhart Boener Van Deuren P.C.

(57) ABSTRACT

Provided is a stacked semiconductor package. The stacked semiconductor package of the present invention comprises: a substrate including at least one contact pad; an external chip laminate which includes a plurality of semiconductor chips mounted on the substrate, and which is stacked in multi-steps such that the ends at one side of the plurality of semiconductor chips alternately protrude in opposite directions to expose bonding pads which are formed on the up-face surface; at least one internal chip which is disposed in a mounting space formed between the external chip laminate and substrate so as to be electrically connected to the substrate; and a conductive wire electrically connecting the bonding pad of the semiconductor chip and the contact pad of the substrate.

10 Claims, 5 Drawing Sheets

180 122 125 121 120 122 180 126 140 141 111 126 140 141 111 110 112 130 132 113

150 122 125 121 120 100 122 126 140 141 111 126 140 141 111 110 112 115 130 132 113

STACKED SEMINCONDUCTOR PACKAGE

TECHNICAL FIELD

The present invention relates to a stacked semiconductor package, and, more particularly, to a stacked semiconductor package in which a stack structure comprising a chip laminate stacked on a substrate and also the substrate configuration may be simply modified, thus ensuring a mounting space and increasing space usability to thereby reduce the size and volume of a package product, and which may reduce the usage of wires upon wire bonding and the length of time required for wire bonding.

BACKGROUND ART

With the recent advancement of the semiconductor industry and the various demands of users, electronic devices are manufactured to be much smaller and lighter, and to have larger capacities and perform multiple functions, and techniques for packaging semiconductor chips used in such electronic devices are intended to form the same or different semiconductor chips into a single unit package depending on the needs.

Chipscale packages wherein the size of a semiconductor package is about 110~120% of the size of a semiconductor chip or die and stacked semiconductor packages comprising a plurality of semiconductor chips stacked to increase the data capacity and the processing speed of the semiconductor devices have been developed.

In the case of a stacked semiconductor package comprising a plurality of semiconductor chips which are stacked, high technology for connecting bonding pads of stacked semiconductor chips and contact pads of a substrate using conductive wires is required.

Thus, to increase data capacity and processing speed by stacking more semiconductor chips in a limited space, the thickness of semiconductor chips has become thinner, and thereby semiconductor chips these days have a thickness of 50 ~100 μm.

FIG. 4 illustrates a conventional stacked semiconductor package. The conventional stacked semiconductor package 1 includes a first cascade chip laminate 20 configured such that a plurality of semiconductor chips 21 is obliquely stacked in a stepped shape on a substrate 10 and bonding pads 22 are thus externally exposed to one side of the top of each of the chips, and a second cascade chip laminate 30 configured such that a plurality of semiconductor chips 31 is obliquely stacked in a stepped shape in the opposite direction on the first cascade chip laminate 20 and thus bonding pads 32 are externally exposed to the other side of the top of each of the chips. The bonding pads 22, 32 of the semiconductor chips 21, 31 of the first and second cascade chip laminates 20, 30 are wire-bonded to contact pads 12, 13 provided on the upper surface of the substrate 10 by means of a plurality of conductive wires 23, 33.

In FIG. 4, the reference numeral 14 designates solder balls provided on the lower surface of the substrate, and the reference numeral 50 designates a molding unit made of a resin on the substrate.

However, in the fabrication of such a conventional stacked semiconductor package 1, in the course of bonding the bonding pads 32 of the semiconductor chips 31 obliquely stacked in a stepped shape on the first cascade chip laminate 20 to the contact pad 13 by means of the conductive wires 33, when an external force is applied to the bonding pads 32 exposed to one side of the top of each of the chips, there is no structure for supporting, from below, the first cascade chip laminate 20 protruding to the left side in the drawing, and thus bouncing is caused upon bonding, undesirably making it difficult to perform a precise wire bonding process, incurring poor bonding, and cracking the adhesive layers 25, 35 of the stacked semiconductor chips.

Furthermore, because the bonding pads 22, 32 and the contact pads 12, 13 should be wire-bonded using the plurality of conductive wires 23, 33, the usage of wires and the length of time required for wire bonding may excessively increase, undesirably raising the manufacturing cost. Also, upon molding, a short may occur between loops due to sweeping of the wire-bonded conductive wires, resulting in poor products.

Moreover, in the case where an electronic part 40 such as a controller is mounted near the first cascade chip laminate 20, it should be disposed at the outside of the substrate due to the bonding region of the conductive wire which wire-bonds the semiconductor chip 21 and the contact pad 12, so a sufficient mounting region has to be ensured, undesirably increasing the size and volume of the package and thus imposing limitations on the carrying out of the miniaturization design.

DISCLOSURE

Technical Problem

Accordingly, the present invention has been made keeping in mind the above problems occurring in the related art, and an object of the present invention is to provide a stacked semiconductor package in which a stack structure comprising a chip laminate on a substrate and also the substrate configuration may be simply modified, thus ensuring a mounting space and increasing space usability to thereby reduce the size and volume of a package product, and which may reduce the usage of wires upon wire bonding and the length of time required for wire bonding.

Technical Solution

In order to accomplish the above objects, the present invention provides a stacked semiconductor package, comprising a substrate having at least one contact pad; an external chip laminate comprising a plurality of semiconductor chips stacked on the substrate, in which one end of each of the plurality of semiconductor chips is alternately protruded in opposite directions so that bonding pads formed on face-up surfaces thereof are externally exposed; at least one internal chip disposed in a mounting space formed between the external chip laminate and the substrate so that the internal chip is electrically connected to the substrate; and a conductive wire which electrically connects the bonding pads of the semiconductor chips and the contact pad of the substrate.

Preferably, the external chip laminate is provided in a stack structure in which an overlapping region between the semiconductor chips which are vertically stacked gradually increases upwards and a width thereof gradually decreases upwards.

Preferably, the external chip laminate includes a support member so as to support free ends of the semiconductor chips having the bonding pads which are wire-bonded with the conductive wire.

More preferably, the support member comprises an elastic material or a thermally conductive material.

Preferably, the internal chip is mounted on a face-down surface of the semiconductor chip corresponding to an opening formed in the substrate or on the substrate, and one end of an inner conductive wire is wire-bonded to a bonding pad of the internal chip and the other end thereof is wire-bonded to a lower contact pad formed on a lower surface of the substrate via the opening.

Preferably, the internal chip is mounted on a recess depressed at a predetermined depth on an upper surface of the substrate, and one end of an inner conductive wire is wire-bonded to a bonding pad of the internal chip and the other end thereof is wire-bonded to a contact pad formed on an upper surface of the substrate.

More preferably, the internal chip is wire-bonded to the contact pad formed on the upper surface of the substrate or a bottom surface of the recess by means of the inner conductive wire, or is flip-bonded to the bottom surface of the recess.

Preferably, the conductive wire comprises a single wire which simultaneously wire-bonds the contact pad of the substrate and the plurality of semiconductor chips.

Preferably, the conductive wire comprises a plurality of wires which individually wire-bond the contact pad of the substrate and the plurality of semiconductor chips.

Preferably, the substrate includes a molding unit which protects the external chip laminate and the conductive wire from an external environment.

Advantageous Effects

According to the present invention, an external chip laminate comprising a plurality of stacked semiconductor chips is formed on the upper surface of a substrate, in which the semiconductor chips are stacked such that the free ends thereof are protruded in opposite directions so as to externally expose bonding pads formed on the face-up surfaces thereof. Also, an internal chip is provided between the external chip laminate and the substrate, and the bonding pads of the semiconductor chips and the contact pad of the substrate are wire-bonded using a conductive wire, thereby fabricating a package. Thus, an electronic part such as a controller is disposed in a mounting space resulting from the simple modification of the substrate configuration and of the stack structure of the semiconductor chips, so that it can be provided between the external chip laminate and the substrate, thus maximally utilizing the limited mounting space of the package and ultimately reducing the size and volume of a package product.

Also, wire bonding between the plurality of semiconductor chips and the substrate can be performed using a single wire member, thus reducing the usage of wires upon wire bonding and the length of time required for wire bonding to thereby decrease the manufacturing cost and increase the price competitiveness. Moreover, a short can be prevented from occurring due to contact between wire loops formed after wire bonding.

Furthermore, the free ends of the semiconductor chips having the bonding pads formed thereon can be stably supported using a support member, thus absorbing an external force which is applied to the semiconductor chips upon wire bonding and minimizing chip movement to thereby prevent the adhesion portion between the chips from cracking, resulting in increased reliability and quality of products.

MODE FOR INVENTION

Hereinafter, a detailed description will be given of the preferred embodiments of the present invention with reference to the appended drawings.

Figure 1A:
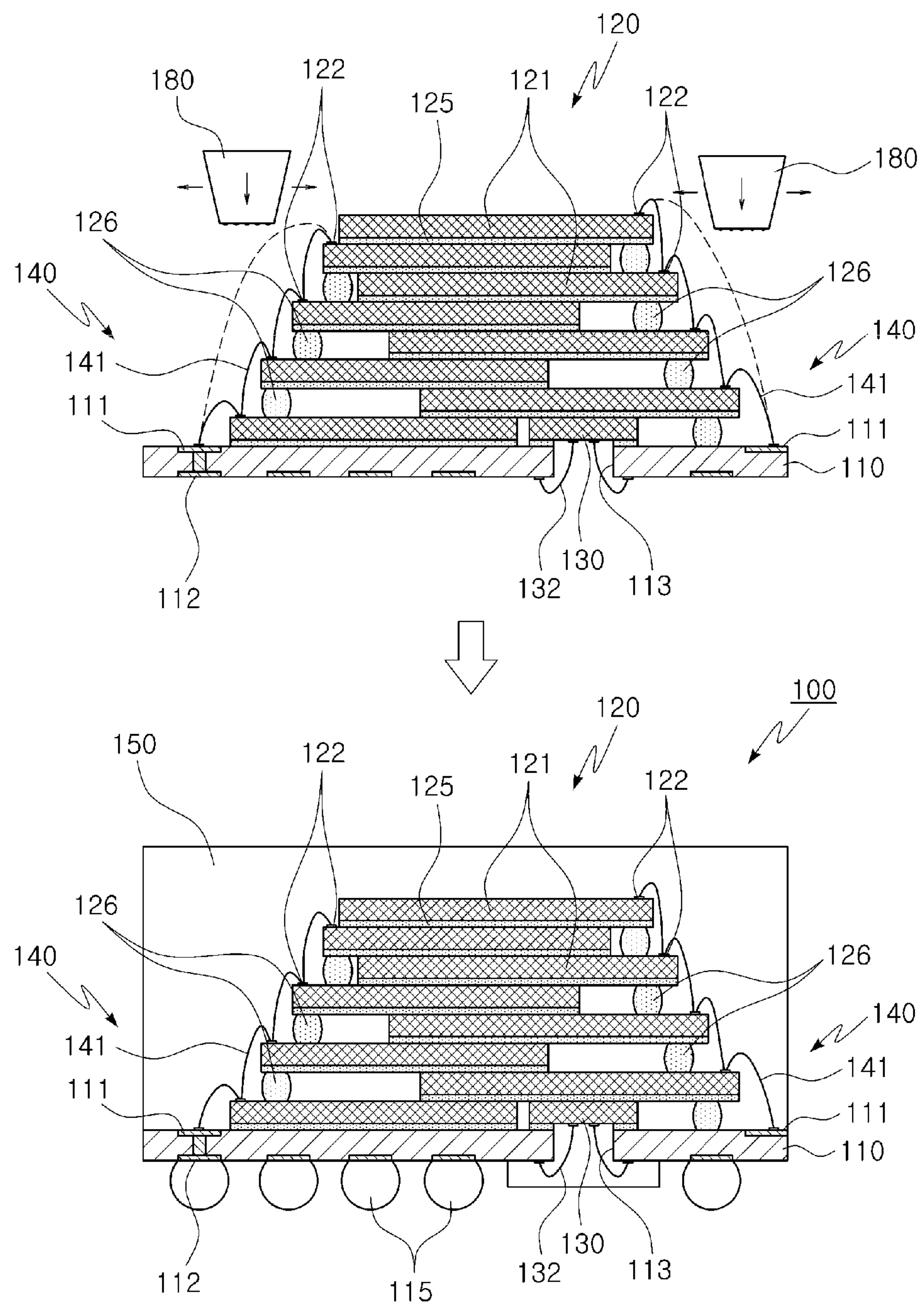
FIG. 1 is a cross-sectional view illustrating a stacked semiconductor package according to a first embodiment of the present invention.
Figure 1B:
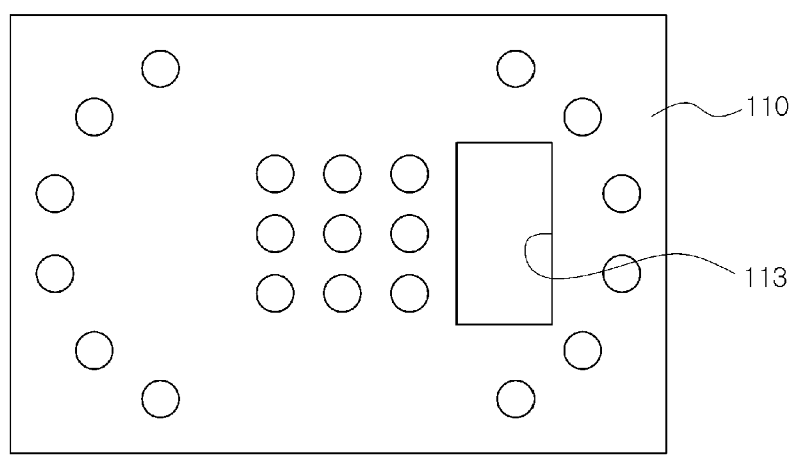

According to a first embodiment of the present invention, as illustrated in FIG. 1, a stacked semiconductor package 100 includes a substrate 110, an external chip laminate 120, an internal chip 130, and a conductive wire 140.

The substrate 110 includes a contact pad 111 which is wire-bonded with the end of the conductive wire 140 on the upper surface thereof, and external terminals 112 such as ball lands on the lower surface thereof to form solder balls 115.

Thus, the substrate 110 may be mounted on a main board via the solder balls 115 applied on the external terminals 112.

An opening 113 or a recess 116 having a predetermined depth may be formed in or on the upper surface of the substrate 110 having the contact pad 111, at a position corresponding to the internal chip 130.

Such a substrate 110 has a pattern circuit on the upper surface thereof, and solder balls 115 applied on ball lands on the lower surface thereof so as to be electrically connected to a main board (not shown), and thereby may be provided as a printed circuit board which may be mounted on the main board.

The external chip laminate 120 includes a plurality of semiconductor chips 121, which are stacked by means of an adhesive layer 125 on the upper surface of the substrate 110 and have bonding pads 122 formed on the face-up surfaces of the ends thereof, and such semiconductor chips 121 are stacked in a stepped shape while the ends thereof having the bonding pads 122 thereon are alternately protruded in opposite directions.

The external chip laminate 120 is provided in the form of a cascade stack structure having a pyramidal shape in which the overlapping region between the vertically stacked semiconductor chips 121 gradually increases upwards and the width thereof gradually decreases upwards.

The semiconductor chips 121 may include any one selected from among memory chips such as SRAM and DRAM, digital integrated circuit chips, RF integrated circuit chips, and base band chips, depending on the type of setting device to which the package is applied.

The external chip laminate 120 which is provided in a cascade stack structure on the substrate 110 includes at least one support member 126 which is in contact with the one end which has the bonding pad 122, that is, the free end, so as to support such an end.

The support member 126 is provided between the semiconductor chip 121 having the bonding pad 122 wire-bonded by the conductive wire 140 at the one end, that is, the free end, and the adjacent semiconductor chip 121 or the substrate 110.

The support member 126 may be formed using a process of dotting the face-up surface of the semiconductor chip with a resin such as epoxy, but the present invention is not limited thereto, and a variety of processes may be applied.

The support member 126 is made of an elastic material so as to elastically support the free ends of the semiconductor chips 121 which are stacked to protrude alternately from both sides thereof on the substrate 110, or of a thermally conductive material to guide heat generated from the semiconductor chips upon driving of the chips to the outside so as to dissipate it.

Thus, as the support member 126 which supports the free ends on which the bonding pads 122 are formed is provided, it may stably perform a supporting function while absorbing an external force generated when one end of the conductive wire 120 is wire-bonded to the bonding pads 122 of the semiconductor chips 121, whereby the adhesion portion between the semiconductor chips may be prevented from cracking, and wire bonding may be stably carried out.

The internal chip 130 is disposed in the mounting space formed between the external chip laminate 120 and the substrate 110 and includes a chip type electronic part such as a controller which is electrically connected to the substrate.

The internal chip 130 is disposed at a position corresponding to the opening 113 formed in the substrate 110 and is attached to the adhesive layer 125 applied on the face-down surface of the semiconductor chip 121 or to the adhesive layer applied on the upper surface of the substrate 110.

The internal chip 130 is electrically connected to the substrate 110 by means of an inner conductive wire 132, one end of which is wire-bonded to the bonding pad, and the other end of which is wire-bonded to the lower contact pad formed on the lower surface of the substrate 110, and the inner conductive wire 132 is wire-bonded via the opening 113.

Figure 2:
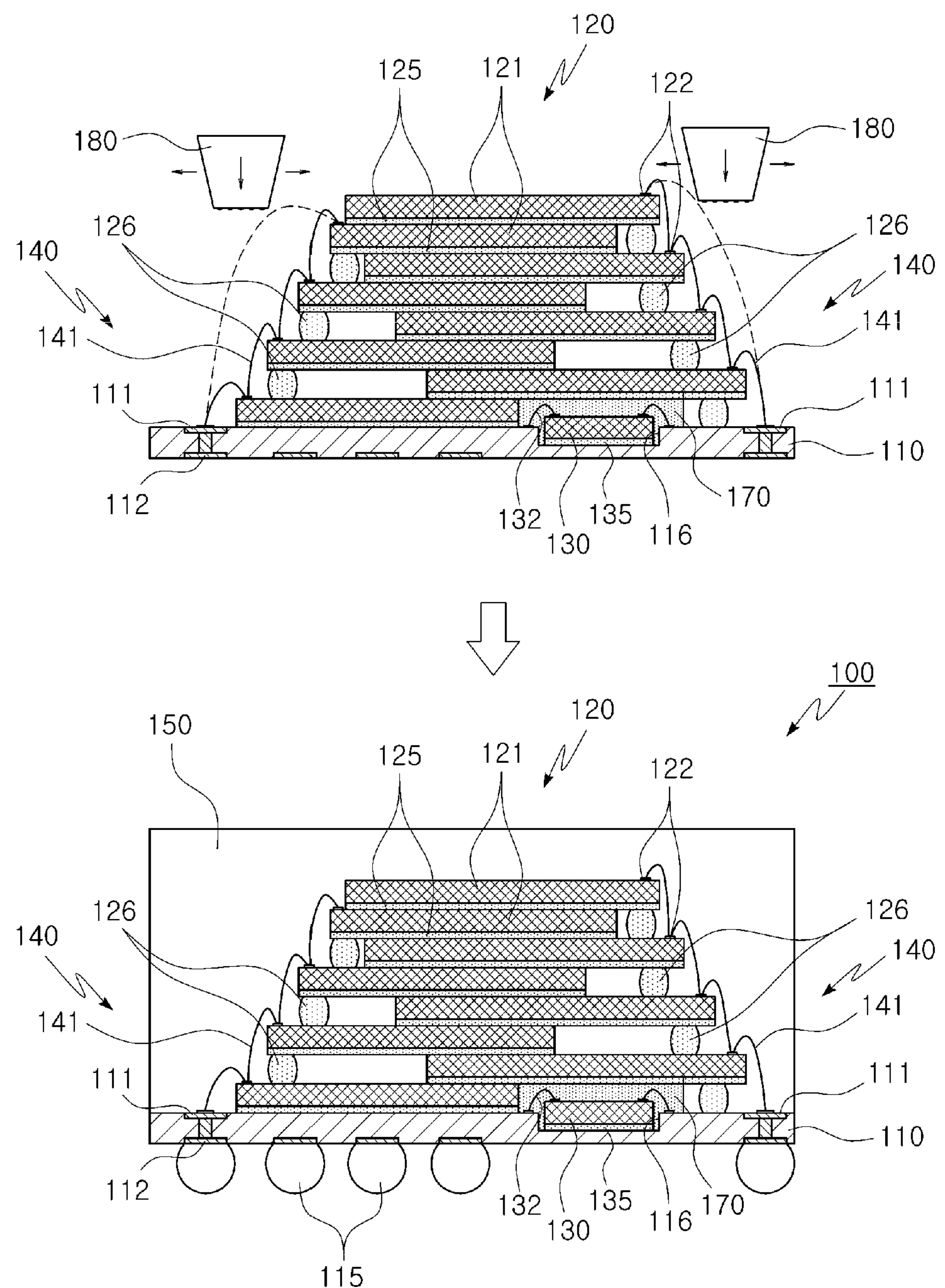
FIG. 2 is a cross-sectional view illustrating a stacked semiconductor package according to a second embodiment of the present invention.
Figure 3:
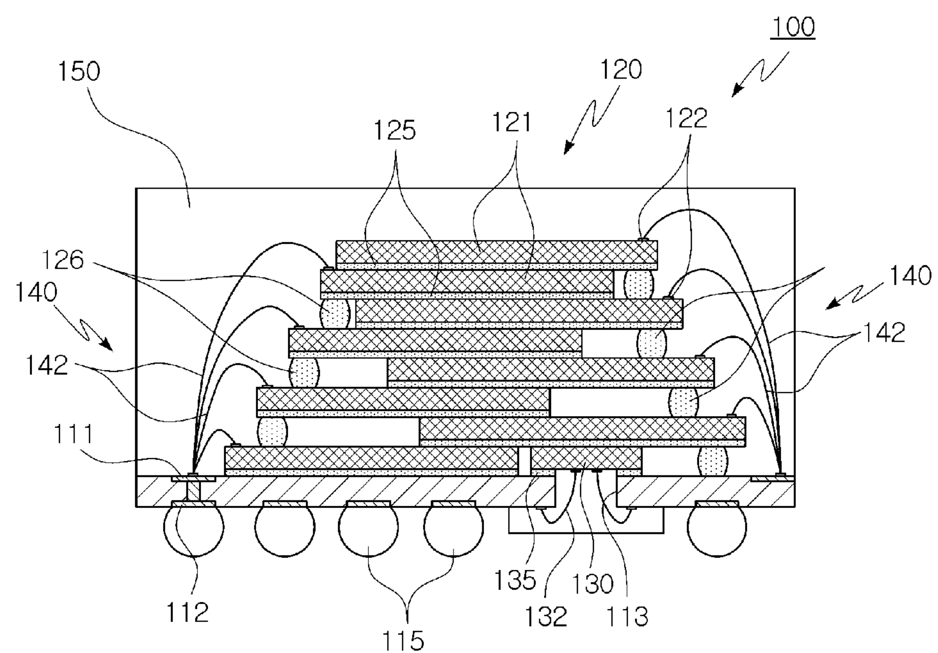
FIG. 3 is a cross-sectional view illustrating a stacked semiconductor package according to a third embodiment of the present invention.

Also, as illustrated in FIG. 2, the internal chip 130 is attached to the recess 116 depressed at a predetermined depth on the upper surface of the substrate by means of an adhesive layer 135.

The recess 116 may be formed in such a manner that a solder resist layer having a thickness of 25~35 μm formed on the upper surface of the substrate 110 is etched and removed by a predetermined thickness of 20~25 μm.

The internal chip 130 is electrically connected to the substrate 110 via the inner conductive wire 132, one end of which is wire-bonded to the bonding pad, and the other end of which is wire-bonded to the contact pad formed on the upper surface of the substrate 110.

Herein, the internal chip 130 is illustratively explained to be wire-bonded to the contact pad formed on the upper surface of the substrate 110 by the inner conductive wire 132, but the present invention is not limited thereto, and it may be flip-bonded to the bottom surface of the recess 116.

The internal chip 130 disposed in the recess 116 may be covered by increasing the size of the support member 126 provided between the semiconductor chip 121 formed on the internal chip 130 and the substrate 110 so as to protect it from an external environment, or may be covered using an internal chip protection unit 170 formed by sufficiently supplying an additional resin to a space between the substrate and the semiconductor chip.

The internal chip protection unit 170 may be made of a resin which is the same as or different from the support member 126, and may be disposed adjacent to the support member or may be spaced apart therefrom.

The internal chip 130 is disposed between the substrate 110 and the external chip laminate 130, thus reducing the size and volume of a package to thereby achieve a light, slim, short and small package, compared to a package wherein a chip type electronic part such as a controller is disposed outside of the laminate.

The conductive wire 140 is composed of a wire member having a predetermined length which is used to perform wire bonding between the bonding pads 122 externally exposed to the face-up surface of one side of the top of each semiconductor chip 121 and the contact pad 111 formed on the upper surface of the substrate 110 so that the semiconductor chips 121 of the external chip laminate 130 are electrically connected to the substrate 110.

The conductive wire 140 which is used to perform wire bonding between the plurality of semiconductor chips 131 of the external chip laminate 130 and the substrate 110 may comprise a single wire member 141, as illustrated in FIGS. 1 and 2, wherein one end of the wire member is wire-bonded to the bonding pad of the uppermost semiconductor chip among the plurality of semiconductor chips 131, the other end thereof is wire-bonded to the contact pad 111 of the substrate 110, and the middle portion thereof is continuously wire-bonded to the bonding pad of the lower semiconductor chip by means of a wire bonding jig 180 for generating heat upon power supply.

In this case, the height of the loop of the conductive wire which wire-bonds the substrate 110 and the semiconductor chips 131 is lowered, thus reducing the total height of the package and enabling the miniaturization design. Upon molding, a short may be prevented from occurring due to sweeping of the wire, and the usage of wires and the length of time required for wire bonding may be reduced.

Figure 4:
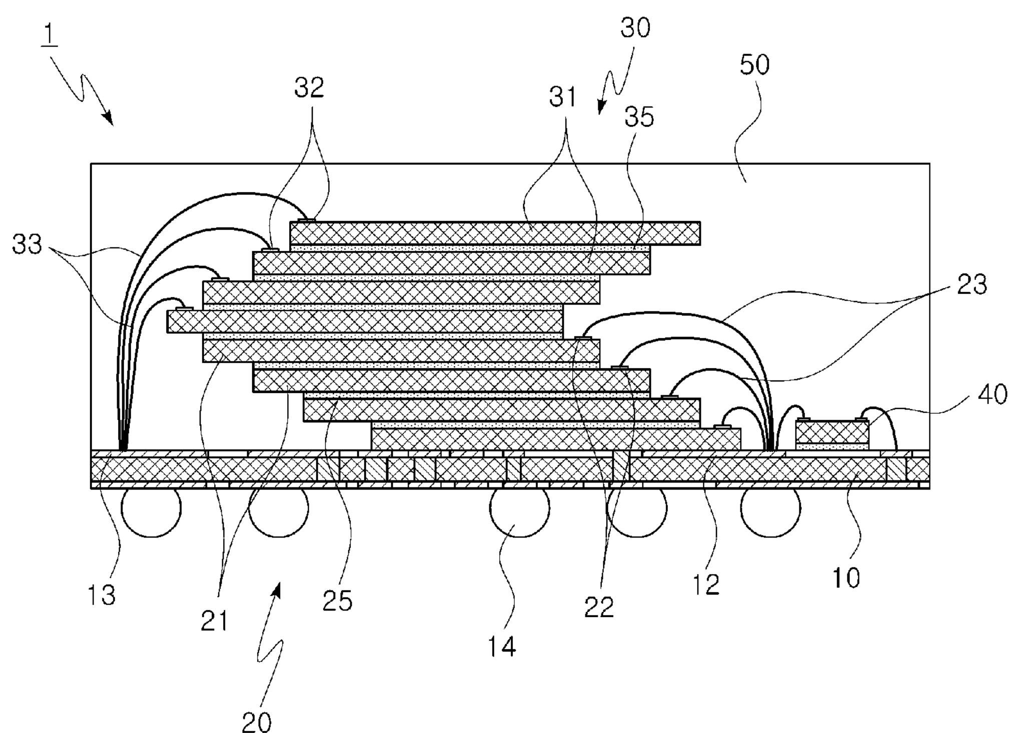
FIG. 4 is a cross-sectional view illustrating a conventional stacked semiconductor package.

Also, as illustrated in FIG. 4, the conductive wire 140 which is wire-bonded to the contact pad 111 of the substrate 110 may include a plurality of wire members 142 such that one end of each of the wire members is wire-bonded to the bonding pads of the plurality of semiconductor chips 121 of the external chip laminate 120 and the other end thereof is separately wire-bonded to the contact pad 111 of the substrate 110.

Furthermore, the substrate 110 includes a molding unit 150 made of a resin sealing material such as an epoxy molding compound to cover the external chip laminate 120 and the conductive wire 140 so as to protect them from an external environment such as corrosion or external physical damage, thereby forming a single package.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A stacked semiconductor package, comprising:

a substrate having at least one contact pad;

an external chip laminate comprising a plurality of semiconductor chips stacked on the substrate, in which one end of each of the plurality of semiconductor chips is alternately protruded in opposite directions so that bonding pads formed on face-up surfaces thereof are externally exposed;

at least one internal chip disposed in a mounting space formed between the external chip laminate and the substrate so that the internal chip is electrically connected to the substrate; and a conductive wire which electrically connects the bonding pads of the semiconductor chips and the contact pad of the substrate.

2. The stacked semiconductor package of claim 1, wherein the external chip laminate is provided in a stack structure in which an overlapping region between the semiconductor chips which are vertically stacked gradually increases upwards and a width thereof gradually decreases upwards.

3. The stacked semiconductor package of claim 1, wherein the external chip laminate includes a support member so as to support free ends of the semiconductor chips having the bonding pads which are wire-bonded with the conductive wire.

4. The stacked semiconductor package of claim 3, wherein the support member comprises an elastic material or a thermally conductive material.

5. The stacked semiconductor package of claim 1, wherein the internal chip is mounted on a face-down surface of the semiconductor chip corresponding to an opening formed in the substrate or on the substrate, and one end of an inner conductive wire is wire-bonded to a bonding pad of the internal chip and the other end thereof is wire-bonded to a lower contact pad formed on a lower surface of the substrate via the opening.

6. The stacked semiconductor package of claim 1, wherein the internal chip is mounted on a recess depressed at a predetermined depth on an upper surface of the substrate, and one end of an inner conductive wire is wire-bonded to a bonding pad of the internal chip and the other end thereof is wire-bonded to a contact pad formed on an upper surface of the substrate.

7. The stacked semiconductor package of claim 6, wherein the internal chip is wire-bonded to the contact pad formed on the upper surface of the substrate or a bottom surface of the recess by means of the inner conductive wire, or is flip-bonded to the bottom surface of the recess.

8. The stacked semiconductor package of claim 1, wherein the conductive wire comprises a single wire which simultaneously wire-bonds the contact pad of the substrate and the plurality of semiconductor chips.

9. The stacked semiconductor package of claim 1, wherein the conductive wire comprises a plurality of wires which individually wire-bond the contact pad of the substrate and the plurality of semiconductor chips.

10. The stacked semiconductor package of claim 1, wherein the substrate includes a molding unit which protects the external chip laminate and the conductive wire from an external environment.

* * * * *

UNITED STATES PATENT AND TRADEMARK OFFICE

CERTIFICATE OF CORRECTION

PATENT NO. : 8,729,688 B2
APPLICATION NO. : 13/697266
DATED : May 20, 2014
INVENTOR(S) : Yong Ha Jung et al.

It is certified that error appears in the above-identified patent and that said Letters Patent is hereby corrected as shown below:

On the Title Page, Item (54) and in the Specification, Column 1, Line 1, in the title of the application, "SEMINCONDUCTOR" should correctly read -- SEMI-CONDUCTOR --.

Signed and Sealed this
Twenty-sixth Day of August, 2014

Michelle K. Lee
*Deputy Director of the United States Patent and Trademark Office*